(12) United States Patent
Grasshoff et al.

(10) Patent No.: US 10,199,479 B2
(45) Date of Patent: Feb. 5, 2019

(54) METHODS OF FORMING A GATE CAP LAYER ABOVE A REPLACEMENT GATE STRUCTURE

(71) Applicant: GLOBALFOUNDRIES Inc., Grand Cayman (KY)

(72) Inventors: Gunter Grasshoff, Radebeul (DE); Catherine Labelle, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 205 days.

(21) Appl. No.: 14/928,681

(22) Filed: Oct. 30, 2015

(65) Prior Publication Data
US 2016/0056263 A1    Feb. 25, 2016

Related U.S. Application Data

(62) Division of application No. 13/352,775, filed on Jan. 18, 2012, now abandoned.

(51) Int. Cl.
| | |
|---|---|
| *H01L 21/28* | (2006.01) |
| *H01L 29/66* | (2006.01) |
| *H01L 21/768* | (2006.01) |
| *H01L 21/3105* | (2006.01) |
| *H01L 21/311* | (2006.01) |
| *H01L 21/321* | (2006.01) |

(52) U.S. Cl.
CPC .. *H01L 29/66545* (2013.01); *H01L 21/31055* (2013.01); *H01L 21/31116* (2013.01); *H01L 21/3212* (2013.01); *H01L 21/76834* (2013.01); *H01L 21/76897* (2013.01)

(58) Field of Classification Search
None
See application file for complete search history.

(56) References Cited

U.S. PATENT DOCUMENTS

| 5,928,962 A | 7/1999 | Farkas et al. |
|---|---|---|
| 6,083,836 A | 7/2000 | Rodder |
| | (Continued) | |

FOREIGN PATENT DOCUMENTS

| CN | 1505120 A | 6/2004 |
|---|---|---|
| CN | 101005037 A | 7/2007 |
| | (Continued) | |

OTHER PUBLICATIONS

Examination Report dated Feb. 13, 2015 from Taiwan Intellectual Property Office for counterpart TW Application No. 101149711, 16 pages.

(Continued)

*Primary Examiner* — Jack Chen
(74) *Attorney, Agent, or Firm* — Amerson Law Firm, PLLC

(57) ABSTRACT

A method includes performing a first chemical mechanical polishing process to define a polished replacement gate structure having a dished upper surface, wherein the polished dished upper surface of the polished replacement gate structure has a substantially curved concave configuration. A gate cap layer is formed above the polished replacement gate structure, wherein a bottom surface of the gate cap layer corresponds to the polished dished upper surface of the polished replacement gate structure.

13 Claims, 6 Drawing Sheets

(56) References Cited

U.S. PATENT DOCUMENTS

| | | |
|---|---|---|
| 6,607,950 B2 | 8/2003 | Henson et al. |
| 7,138,323 B2 | 11/2006 | Kavalieros et al. |
| 7,208,361 B2 | 4/2007 | Shah et al. |
| 7,754,552 B2 | 7/2010 | Barns et al. |
| 7,892,911 B2 | 2/2011 | Wood et al. |
| 8,062,966 B2 | 11/2011 | Mehrad et al. |
| 8,119,508 B2 | 2/2012 | Kavalieros et al. |
| 8,138,038 B2 | 3/2012 | Heinrich et al. |
| 8,148,786 B2 | 4/2012 | Kavalieros et al. |
| 8,153,498 B2 | 4/2012 | Hsu et al. |
| 2001/0049183 A1 | 12/2001 | Henson et al. |
| 2007/0057331 A1 | 3/2007 | Satou |
| 2009/0159978 A1* | 6/2009 | Matsubara ........ H01L 21/76897 257/368 |
| 2010/0330790 A1 | 12/2010 | Hempel et al. |
| 2011/0062501 A1 | 3/2011 | Soss et al. |
| 2011/0076844 A1 | 3/2011 | Heinrich et al. |
| 2011/0269381 A1 | 11/2011 | Groschopf et al. |
| 2012/0083121 A1 | 4/2012 | Ando et al. |

FOREIGN PATENT DOCUMENTS

| | | |
|---|---|---|
| JP | 2000307103 A | 11/2000 |
| TW | 432505 B | 5/2001 |
| TW | 200608471 A | 3/2006 |

OTHER PUBLICATIONS

Office Action dated Mar. 2, 2015 from Chinese Patent Office for counterpart CN Application No. 201310020347.8, 12 pages.

Translation of Chinese Office Action dated Apr. 5, 2016 for CN Appl. No. 201310020347.8, filed on Jan. 18, 2013.

Translation of Chinese Office Action dated Aug. 23, 2016 for CN Appl. No. 201310020347.8, filed on Jan. 18, 2013.

Translation of Chinese Office Action dated Nov. 3, 2015 for CN Appl. No. 201310020347.8, filed on Jan. 18, 2013.

\* cited by examiner

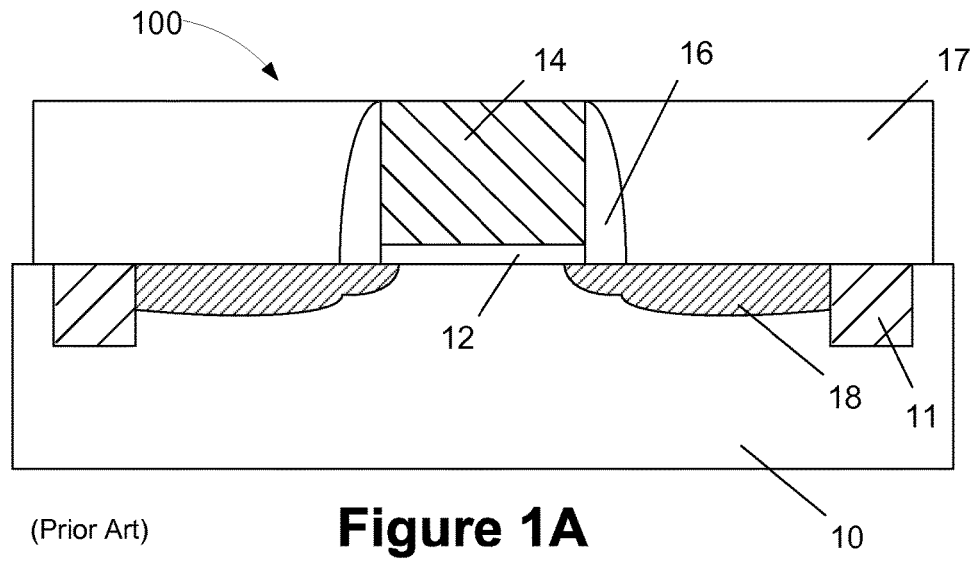
(Prior Art) Figure 1A
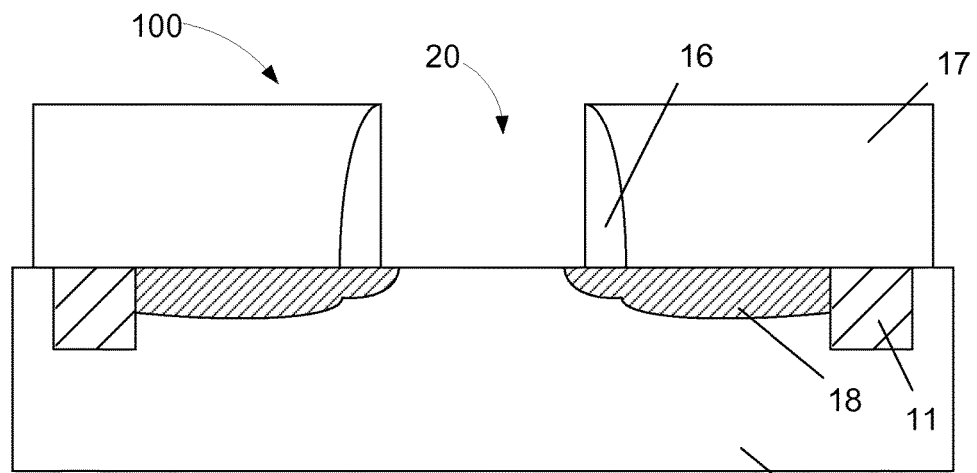
(Prior Art) Figure 1B

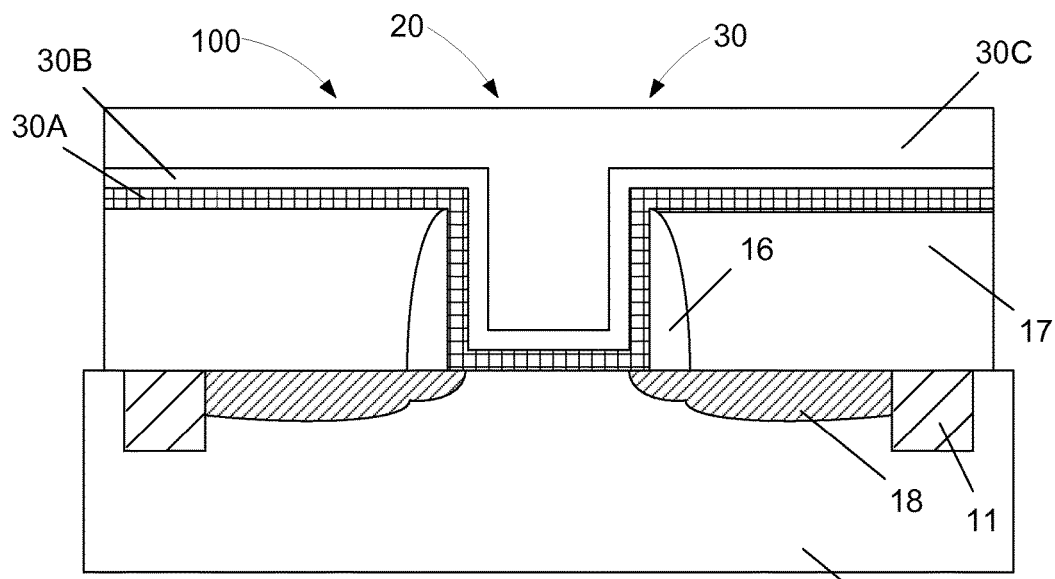
(Prior Art) Figure 1C
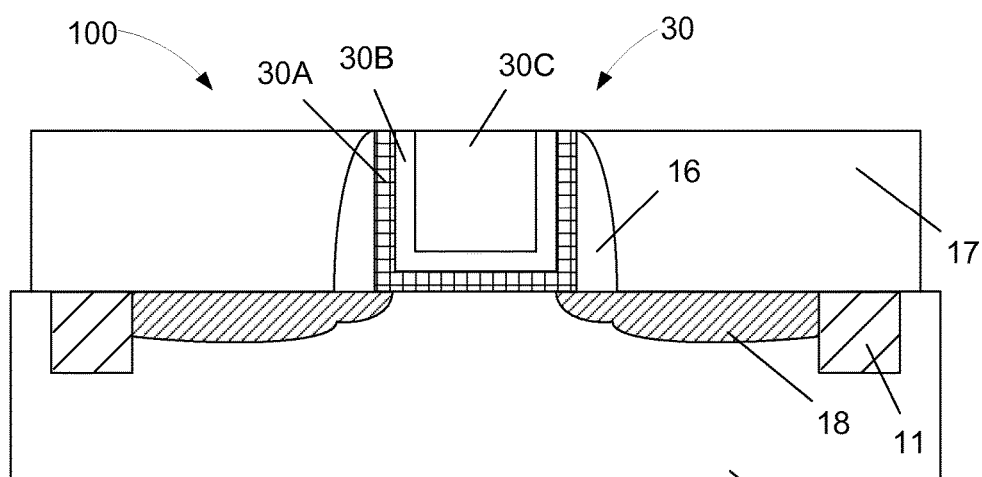
(Prior Art) Figure 1D

METHODS OF FORMING A GATE CAP LAYER ABOVE A REPLACEMENT GATE STRUCTURE

BACKGROUND

1. Field of the Disclosure

Generally, the present disclosure relates to sophisticated semiconductor devices and the manufacturing of such devices, and, more specifically, to various methods of forming a gate cap layer above a replacement gate structure.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout and a specific flow of process operations. Field effect transistors (NMOS and PMOS transistors) represent one important type of circuit element used in manufacturing such integrated circuit products. A field effect transistor, irrespective of whether an NMOS transistor or a PMOS transistor is considered, is typically comprised of doped source and drain regions that are formed in a semiconducting substrate and are separated by a channel region. A gate insulation layer is positioned above the channel region and a conductive gate electrode is positioned above the gate insulation layer. By applying an appropriate voltage to the gate electrode, the channel region becomes conductive and current is allowed to flow between the source region and the drain region.

In modern, ultra-high density integrated circuit products, the channel length of the transistors used in such products, i.e., the lateral spacing between the source region and the drain region, has been steadily decreased in size to enhance the performance of the transistors and the overall functionality of integrated circuit products incorporating such transistors. For example, as channel lengths are decreased, the transistors tend to exhibit higher drive current capabilities and faster switching speeds as compared to earlier generations of transistors. Efforts to reduce the channel length of transistors continue to this day as device designers are under constant pressure to improve the performance of such transistors.

However, the historical and ongoing reduction in channel length of transistors, along with the reduction in size of other features of the transistors, causes certain problems that may at least partially offset the advantages that may be obtained by reduction in the channel length of the device. For example, as the channel length of transistors decreases, the pitch between adjacent transistors likewise decreases, thereby limiting the physical size of conductive contact elements—e.g., those elements that provide electrical connection to the transistor, such as contact vias and the like—that may fit within the available real estate between adjacent transistors. Accordingly, the electrical resistance of such conductive contact elements becomes a significant issue in the overall transistor design, since the cross-sectional area of these elements is correspondingly decreased. Moreover, the cross-sectional area of the contact vias, together with the characteristics of the materials they comprise, may have a significant influence on the effective electrical resistance and overall performance of these circuit elements. Additionally, the small spacing between adjacent transistors has made it more challenging to precisely locate and form the conductive contact elements in the proper location on the integrated circuit product. For example, if a conductive contact is misaligned, e.g., if it is partially formed on a source region and an adjacent gate structure, the device may not perform as designed and, in a worst-case scenario, such misalignment may establish a short circuit that may lead to complete device failure.

For many early device technology generations, the gate electrode structures of most transistor elements have been made of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprised of alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in a HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), lanthanum, etc.

One well-known processing method that has been used for forming a transistor with a high-k/metal gate structure is the so-called "gate last" or "replacement gate" technique. FIGS. 1A-1D is a simplified depiction of one illustrative prior art method for forming an HK/MG replacement gate structure using a gate-last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial or dummy gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate using known masking and ion implantation techniques. Of course, those skilled in the art will recognize that there are other features of the transistor 100 that are not depicted in the drawings for purposes of clarity. For example, so-called halo implant regions are not depicted in the drawings, as well as various layers or regions of silicon germanium that are typically found in high-performance PMOS transistors. At the point of fabrication depicted in FIG. 1A, the various structures of the device 100 have been formed and sequence of steps were performed to remove any materials above the sacrificial gate electrode 14 (such as a protective gate cap layer (not shown) comprised of silicon nitride) so that the sacrificial gate electrode 14 may be removed.

As shown in FIG. 1B, one or more etching processes are performed to remove the sacrificial gate electrode 14 and the sacrificial gate insulation layer 12 to thereby define a gate opening 20 where a replacement gate structure will be subsequently formed. Typically, the sacrificial gate insulation layer 12 is removed as part of the replacement gate technique, as depicted herein. However, the sacrificial gate insulation layer 12 may not be removed in all applications, depending upon the material of construction for the gate insulation layer.

Next, as shown in FIG. 1C, various layers of material that will constitute a replacement gate structure 30 are formed in the gate opening 20. In one illustrative example, the replacement gate structure 30 is comprised of a high-k gate insulation layer 30A, a work-function adjusting layer 30B comprised of a metal (e.g., a layer of titanium nitride) and a bulk metal layer 30C (e.g., aluminum). Ultimately, as shown in FIG. 1D, a chemical mechanical polishing (CMP) process is performed to remove excess portions of the gate insulation layer 30A, the work-function adjusting layer 30B and the bulk metal layer 30C positioned outside of the gate opening 20 to define the replacement gate structure 30.

One important aspect of the replacement gate technique involves the formation of a protective dielectric layer (not shown) above the replacement gate structure 30 after the replacement gate structure 30 is formed. Such a protective layer acts to protect the replacement gate structure 30 in subsequent processing operations, such as the various process operations performed to form conductive contacts to the source/drain regions 18. Protection of the replacement gate structure 30 is even more important as device dimensions continue to shrink and the use of self-aligned contact formation techniques are employed in forming conductive contacts to the transistor 100. One technique that has been employed in the past is to simply form another layer of material above the replacement gate structure 30 using known deposition techniques. However, such techniques involve performing a number of time-consuming processing operations and perhaps require hard-masking and patterning, which is not feasible with current lithographic alignment capabilities. More recently, efforts made to form such a protective layer have included oxidizing, nitriding or fluorinating the metal portions of the replacement gate structure 30. See, for example, US Patent Publication No. 2011/0062501. However, as the gate length of the device 100 is scaled, the proportion of the work function adjusting layer 30B becomes much greater as compared to the other layers that make up the replacement gate structure 30. Forming the metal-containing insulating material by oxidation or nitridation of such a work function adjusting layer 30B comprised of, for example, titanium nitride or tantalum nitride has proven to be difficult. Additionally, there is often a stringent constraint on the allowable temperature of the oxidation or nitridation process, which tends to make the oxidation or nitridation of metals more difficult. With fluorination, it is very difficult to form a sufficiently thick oxide cap layer to protect the underlying replacement gate structure 30.

The present disclosure is directed to various methods of forming a gate cap layer above a replacement gate structure and various devices having such a gate cap layer that may solve, or at least reduce, one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various methods of forming a gate cap layer above a replacement gate structure. In one exemplary embodiment, a method is disclosed that includes performing a first chemical mechanical polishing process to define a polished replacement gate structure having a dished upper surface, wherein the polished dished upper surface of the polished replacement gate structure has a substantially curved concave configuration. The disclosed method further includes, among other things, forming a gate cap layer above the polished replacement gate structure, wherein a bottom surface of the gate cap layer corresponds to the polished dished upper surface of the polished replacement gate structure.

Another illustrative method of the present disclosure includes the steps of forming a replacement gate structure in a gate opening defined by sidewall spacers positioned in a layer of insulating material, and performing a common etching process on at least the sidewall spacers and the layer of insulating material, wherein, after completing the common etching process, an etched upper surface of the sidewall spacers is recessed relative to an etched upper surface of the layer of insulating material and an upper surface of the replacement gate structure extends above the etched upper surface of the layer of insulating material. The exemplary method further includes, among other things, after performing the common etching process, performing a first chemical mechanical polishing process to remove at least portions of the replacement gate structure that extend above the etched upper surface of the layer of insulating material and thereby define a polished replacement gate structure having a polished upper surface. Moreover, after performing the first chemical mechanical polishing process, a gate cap layer is formed above the polished upper surface of the polished replacement gate structure.

In yet a further exemplary embodiment disclosed herein, a method includes, among other things, forming a replacement gate structure in a gate opening defined by sidewall spacers positioned in a layer of insulating material, and performing a common etching process on at least the sidewall spacers and the layer of insulating material, wherein, after completing the common etching process, an etched upper surface of the sidewall spacers is recessed relative to an etched upper surface of the layer of insulating material and an upper surface of the replacement gate structure extends above the etched upper surface of the layer of insulating material. Furthermore, after performing the common etching process, a first chemical mechanical polishing process is performed so as to remove at least portions of the replacement gate structure that extend above the etched upper surface of the layer of insulating material and thereby define a polished replacement gate structure having a dished upper surface, wherein the polished dished upper surface of the polished replacement gate structure has a substantially curved concave configuration. Moreover, after performing the first chemical mechanical polishing process, a gate cap layer is formed above the polished dished upper surface of the polished replacement gate structure, the gate cap layer having a bottom surface that corresponds to the polished dished upper surface of the polished replacement gate structure.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a gate last or replacement gate approach;

Figure 2A:
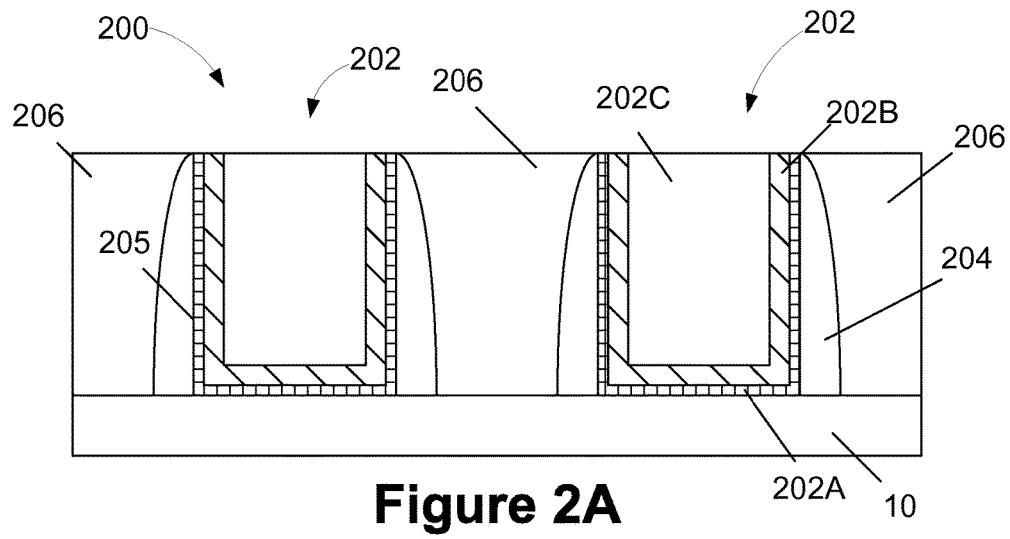
FIGS. 2A-2F depict one illustrative process flow disclosed herein for forming a gate cap layer above a replacement gate structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to depict one illustrative process flow disclosed herein for forming a gate cap layer above a replacement gate structure and a device having such a gate cap layer. As will be readily apparent to those skilled in the art upon a complete reading of the present application, the device disclosed herein may be employed with a variety of technologies, e.g., NMOS, PMOS, CMOS, etc., and it may be incorporated into a variety of integrated circuit products. With reference to the attached drawings, various illustrative embodiments of the methods and devices disclosed herein will now be described in more detail. It should be understood that the various features and layers in the attached drawing may not be to scale so as to facilitate disclosure of the present inventions.

FIGS. 2A-2F depict one illustrative technique disclosed herein for forming a protective cap layer above a replacement gate structure. FIG. 2A is a simplified view of an illustrative semiconductor device 200 at an early stage of manufacturing that is formed above a semiconducting substrate 10. At the point of fabrication depicted in FIG. 2A, the device 200 includes a plurality of replacement gate structures 202 that have been formed in a gate opening 205 defined by illustrative sidewall spacers 204 that are positioned in a layer of insulating material 206. The gate openings 205 were formed by removing a sacrificial gate insulation layer (not shown) and a sacrificial gate electrode (not shown) in a similar fashion to that described above in connection with the illustrative prior art replacement gate technique shown in FIGS. 1A-1D. In general, in FIG. 2A, the device 200 is depicted at the point of fabrication that corresponds to that depicted in FIG. 1D for the device 100 discussed in the background section of the application, i.e., after the replacement gate structures have been formed. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

In the illustrative embodiment depicted herein, the replacement gate structures 202 are comprised of a high-k gate insulation layer 202A, a first metal layer 202B and a second metal layer 202C. In a more specific example, the first metal layer 202B may be comprised of a work-function adjusting metal (e.g., a layer of titanium nitride), while the second layer of metal 202C may be a layer of aluminum or tungsten, etc. In other embodiments, one or more additional metal layers may be formed as part of the replacement gate structures 202, although such an additional metal layer(s) is not shown in the drawings. As will be recognized by those skilled in the art after a complete reading of the present application, the insulating materials and the metal layer(s) that are part of the replacement gate structures 202 may be of any desired construction and comprised of any of a variety of different materials. Additionally, the replacement gate structure 202 for an NMOS device may have different material combinations as compared to a replacement gate structure 202 for a PMOS device. Thus, the particular details of construction of replacement gate structures 202, and the manner in which such replacement gate structures 202 are formed, should not be considered a limitation of the present invention. The methods disclosed herein may also be employed with replacement gate structures 202 that do not employ a high-k gate insulation layer, although a high-k gate insulation layer will likely be used in most applications.

In one illustrative embodiment disclosed herein, the sidewall spacers 204 may be comprised of a material that will etch at a faster rate than the material used for the layer of insulating material 206 when both the sidewall spacers 204 and the layer of insulating material 206 are exposed to a common etching process. Of course, this common etching process should be designed such that it does not damage the materials of the replacement gate structure 202, as those materials may also be exposed to this common etching process. In one illustrative embodiment, the layer of insulating material 206 may be comprised of a silicon dioxide material, such as a TEOS-based oxide, a flowable oxide, an HDP oxide, etc., while the sidewall spacers 204 may be made of a silicon nitride or other dielectric materials that are suitable for spacer applications. The thickness of the layer of insulating material 206 and the base thickness of the sidewall spacer 204 may vary depending upon the particular application.

Figure 2B:
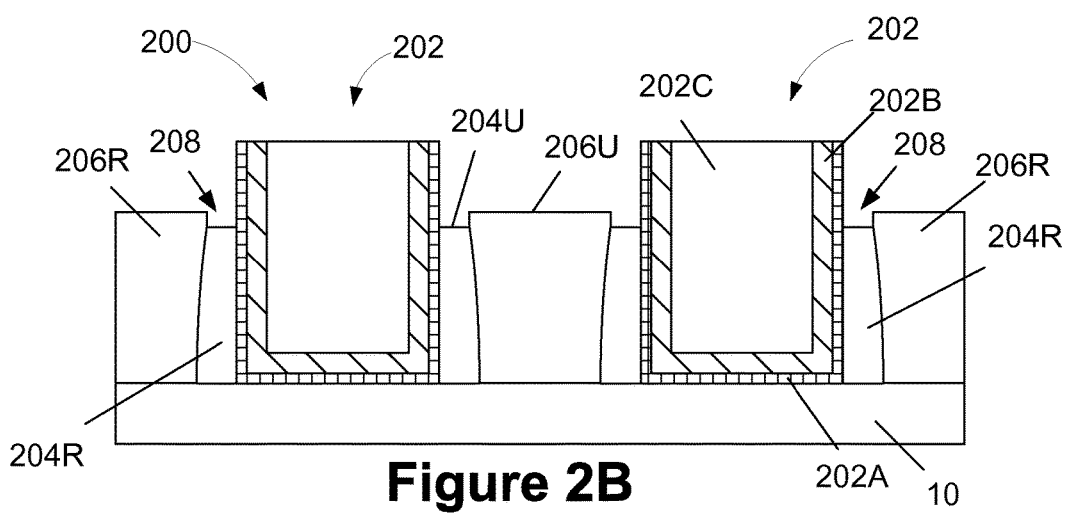

FIG. 2B depicts the device 200 after the common etching process has been performed to define recessed sidewall spacers 204R and a recessed layer of insulating material 206R. Due to the higher etch rate for the sidewall spacers 204, there is a difference in height between the recessed sidewall spacers 204R and the recessed layer of insulating material 206R, as schematically depicted by the recess 208 in FIG. 2B. Stated another way, an upper surface 204U of the sidewall spacer 204R is recessed relative to an upper surface 206U of the recessed layer of insulating material 206R. The depth of the recess 208 may vary depending upon the materials used for the sidewall spacers 204 and the layer of insulating material 206 and the etching process. In one illustrative example, the depth of the recess 208 may be on the order of about 5-15 nm. In one particularly illustrative embodiment where the layer of insulating material 206 is comprised of silicon dioxide and the sidewall spacers 204 are comprised of silicon nitride, the etching process may be a dry, anisotropic based etching process using a $C_xH_yF_z$ based chemistry that is sufficiently selective to silicon dioxide. In one illustrative embodiment, the common etching process common is adjusted to provide etch selectivity between silicon nitride and silicon dioxide. The duration of the etching process may also vary depending upon the various materials of construction and the desired depth of the recess 208.

Figure 2C:
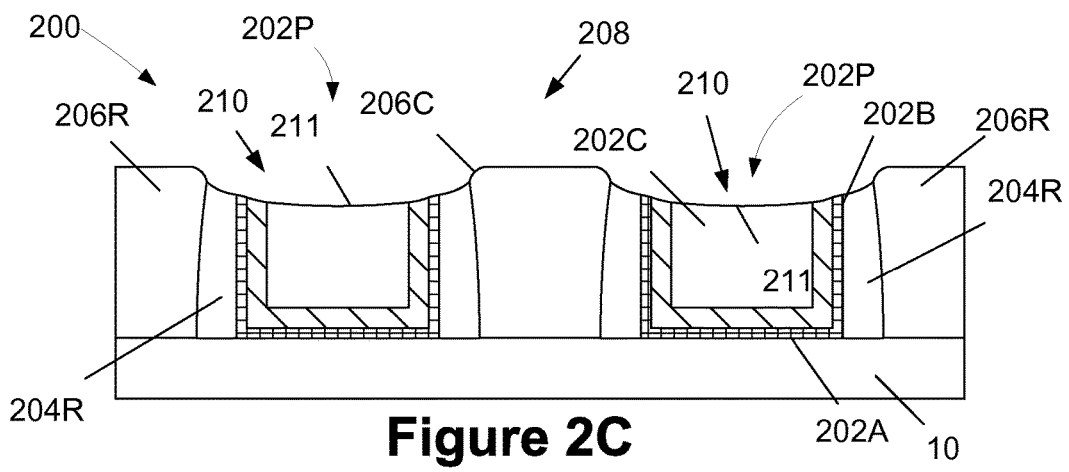

Next, as shown in FIG. 2C, a chemical mechanical polishing (CMP) process is performed on the device 200 that results in the definition of polished replacement gate structures 202P. The CMP process acts to remove excess portions of the gate insulation layer 202A, the first metal layer 202B and the second metal layer 202C that were exposed after the common etching process described above was performed. The CMP process is also designed to remove at least some portions of the original replacement gate structure 202 and the sidewall spacers 204 to thereby define a recess 210 above the polished replacement gate structures 202P. In some cases, more or different types of abrasives and/or chemicals may be employed in the CMP process to produce the recesses 210. In one illustrative embodiment, the CMP process may result in at least a portion of the polished replacement gate structures 202P having a polished, dished surface 211. The depth and degree of the recess 210 may vary depending upon the materials used for the layer of insulating material 206, the sidewall spacers 204 and the replacement gate structures 202 as well as the parameters of the CMP process. In one illustrative embodiment, the peak depth of the recess 210 may be about 5-15 nm. The CMP process may also result in the rounding of the corners 206C of the layer of insulating material 206, as shown in FIG. 2C.

Figure 2D:
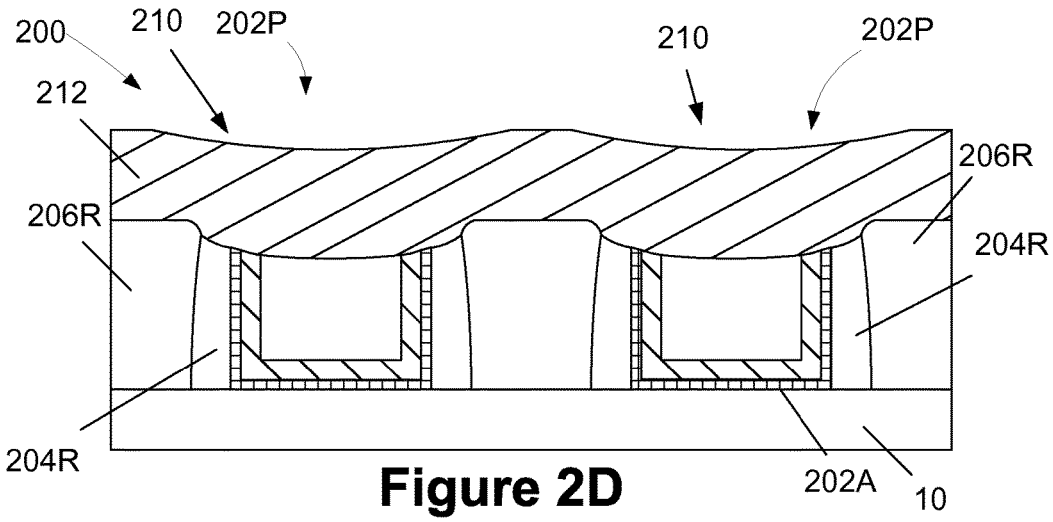

Then, as shown in FIG. 2D, a gate cap layer 212 is formed above the device 200 such that it over-fills the recesses 210. In one illustrative embodiment, the gate cap layer 212 should be made of a material that may withstand etching processes that will be performed on the layer of insulating material 206. Stated another way, the gate cap layer 212 may be comprised of a material that will protect the underlying polished replacement gate structure 202P when an etching process is performed on the layer of insulating material 206, as described more fully below. In some cases, the gate cap layer 212 may be comprised of the same material as the sidewall spacers 204, although that is not required in all applications. In one illustrative embodiment, the gate cap layer 212 may be a layer of silicon nitride with a thickness within the range of about 30-50 nm that was formed by performing a CVD process.

Figure 2E:
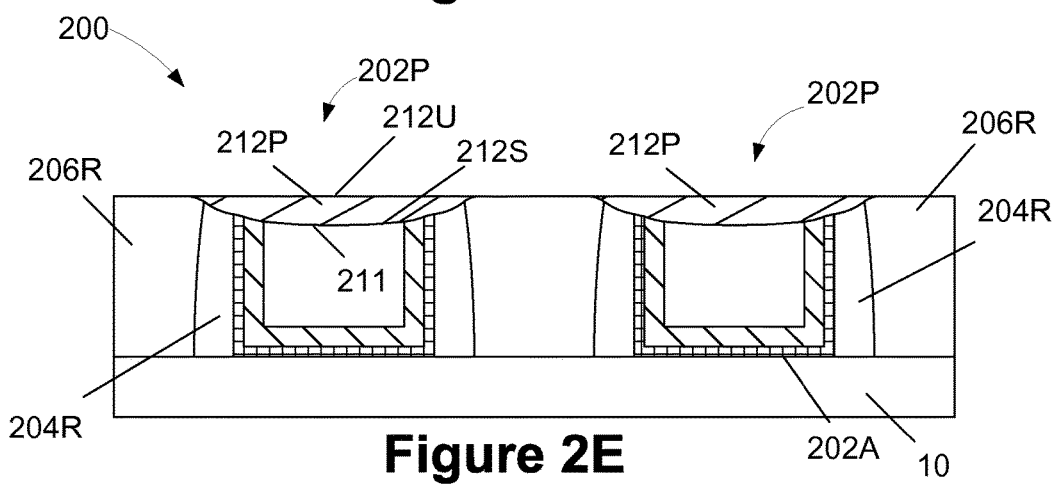

Next, as shown in FIG. 2E, another CMP process is performed to remove excess portions of the gate cap layer 212 positioned outside of the recesses 210. The process results in the definition of protective gate cap layers 212P positioned above each of the polished replacement gate structures 202P. The protective gate cap layer 212P has a polished upper surface 212U and a bottom surface 212S that corresponds to the polished, dished surface 211 of the polished replacement gate structure 202P. As can be seen in FIG. 2E, the gate cap layer 212P and the sidewall spacers 204R encapsulate or protect the polished replacement gate structure 202P.

Figure 2F:
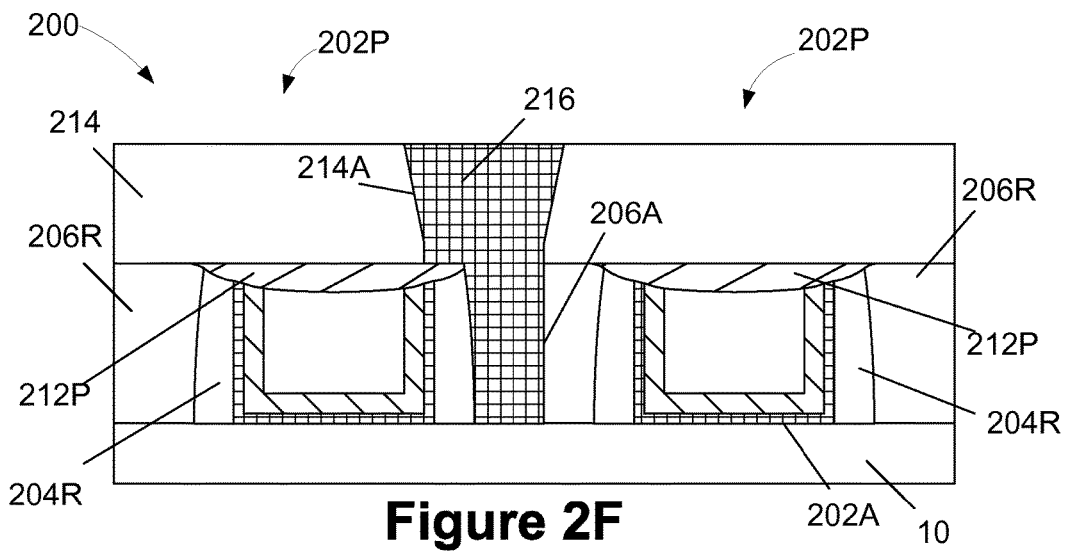

FIG. 2F depicts the device 200 after several process operations have been performed to form a conductive contact 216 for the device 200. The contact 216 is intended to be representative in nature of any type of conductive contact structure that may be formed on integrated circuit devices. To the extent that formation of the conductive contact 216 involves the formation of one or more barrier layers, such barrier layers are not depicted in the drawings so as not to obscure the present inventions. The conductive contact 216 may be made from a variety of conductive materials, e.g., aluminum, tungsten, copper, etc., and it may be formed using traditional techniques. For example, the conductive structure 216 may be formed using self-aligned techniques. In the depicted example, a layer of insulating material 214 is formed above the device 200 and a plurality of openings 214A, 206A are forming in the layers of insulating material 214, 206R, respectively, using known photolithography tools and techniques. One or more deposition processes are then performed to form one or more conductive materials in the openings 214A, 206A. A CMP process may then be performed to remove the excess amounts of conductive material positioned outside of the opening 214A to thereby result in the definition of the conductive contact 216. In the depicted example, the conductive contact 216 may be formed to establish electrical connection to a source or drain region (not shown) formed in the substrate 10 between the two depicted polished replacement gate structures 202PP. In FIG. 2F, the conductive contact 216 is depicted as being slightly misaligned in that part of the conductive contact 216 is formed above the sidewall spacer 204R and a portion of the polished replacement gate structure 202P. However, the gate cap layer 212P protects the underlying polished replacement gate structure 202P from damage associated with the processes used to form the openings 214A, 206A in the layers of insulating material 214, 206.

Figure 3A:
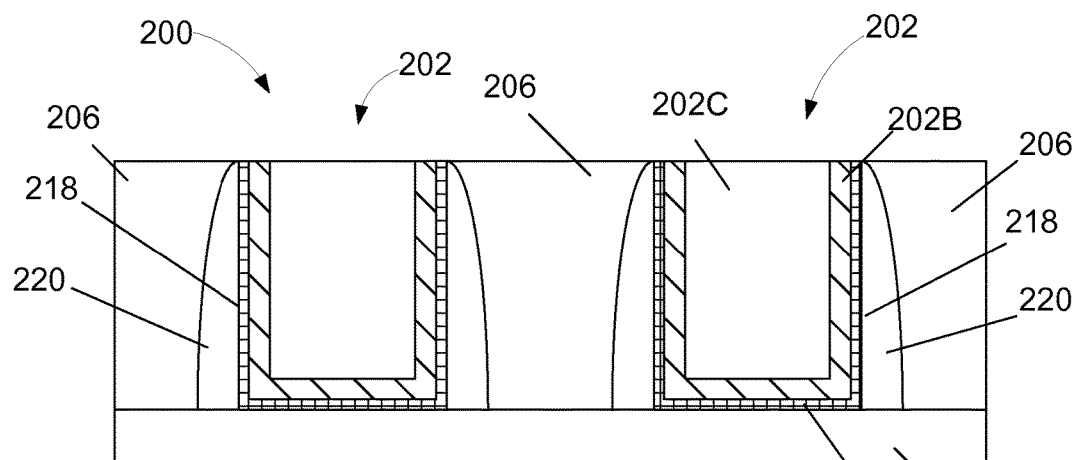
FIGS. 3A-3E depict another illustrative process flow disclosed herein for forming a gate cap layer above a replacement gate structure.

FIGS. 3A-3E depict another illustrative technique disclosed herein for forming a protective cap layer above a replacement gate structure. FIG. 3A depicts the device at a similar stage of fabrication as depicted in FIG. 2A—a plurality of replacement gate structures 202 have been formed in gate openings 218 defined by sidewall spacers 220. Unlike the process flow depicted in FIGS. 2A-2F, in this illustrative process flow, it is not required that the sidewall spacers 220 be comprised of a material that will etch at a faster rate than the material used for the layer of insulating material 206 when both the sidewall spacers 220 and the layer of insulating material 206 are exposed to a common etching process, although such materials exhibiting such characteristics may be employed in this embodiment if desired. Rather, the sidewall spacers 220 may simply be made of a material that will protect the polished replacement gate structure 202P when a subsequent etching process is performed to define an opening in the layer of insulating material 206 for a conductive contact.

Figure 3B:
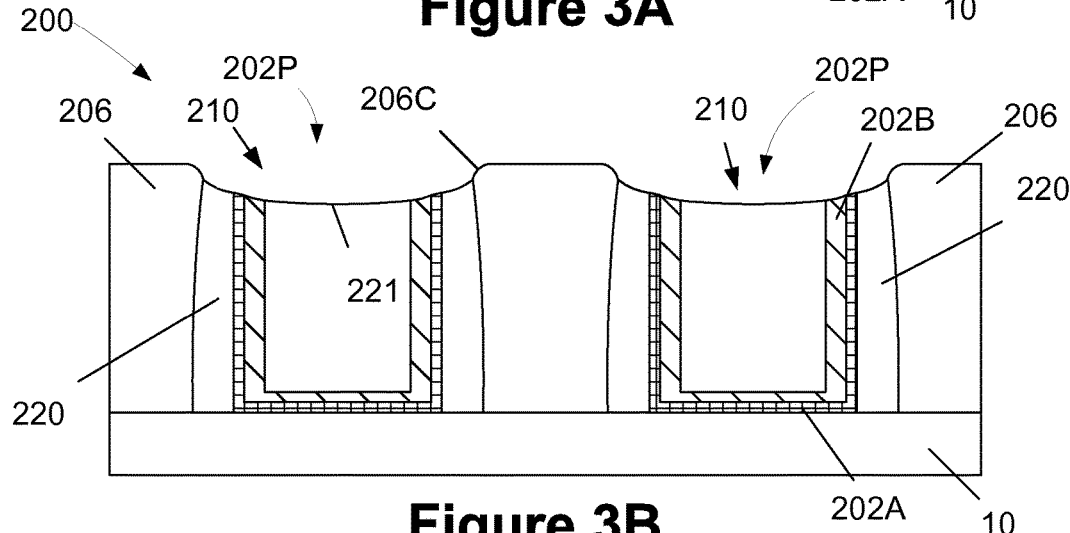

Next, as shown in FIG. 3B, a chemical mechanical polishing (CMP) process is performed on the device 200 to define a plurality of polished replacement gate structures 202P. The CMP process acts to remove portions of the gate insulation layer 202A, the first metal layer 202B and the second metal layer 202C and perhaps at least some portions of the sidewall spacers 220 to thereby define a recess 210 above the polished replacement gate structures 202P. In some cases, more or different types of abrasives and/or chemicals may be employed in the CMP process to produce the recesses 210. As before, the CMP process may result in at least a portion of the polished replacement gate structures 202P having a polished, dished surface 221. The depth and degree of the recess 210 may vary depending upon the materials used for the layer of insulating material 206, the sidewall spacers 220 and the replacement gate structures 202, as well as the parameters of the CMP process. In one illustrative embodiment, the peak depth of the recess 210 may be about 5-15 nm. The CMP process may also result in the rounding of the corners 206C of the layer of insulating material 206, as shown in FIG. 3B. The CMP process that results in the polished replacement gate structures 202P may be a separate CMP process that is performed after an initial CMP process was performed to initially define the replacement gate structures 202 (with the substantially planar upper surface) shown in FIG. 3A, or it may be part of the initial CMP process wherein the process conditions or material of the initial CMP process may be modified toward the end of the initial CMP process to define the polished replacement gate structures 202P shown in FIG. 3B.

Figure 3C:
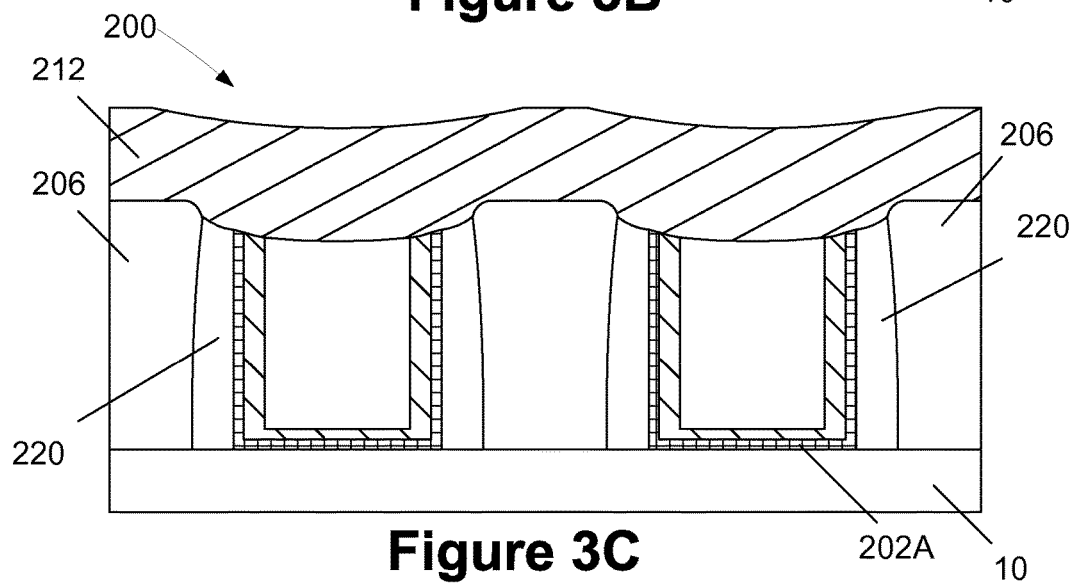
Figure 3D:
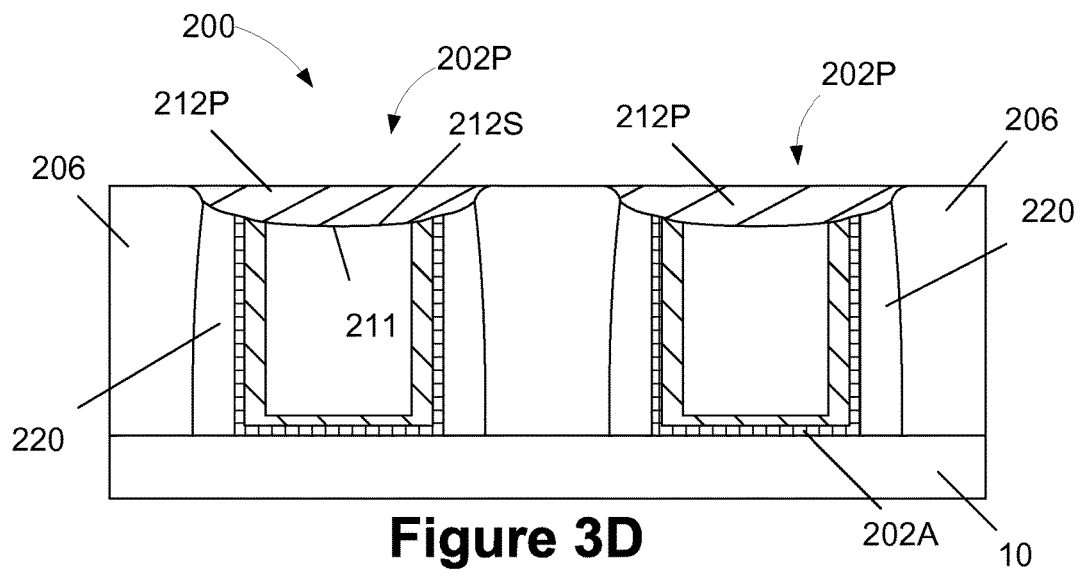
Figure 3E:
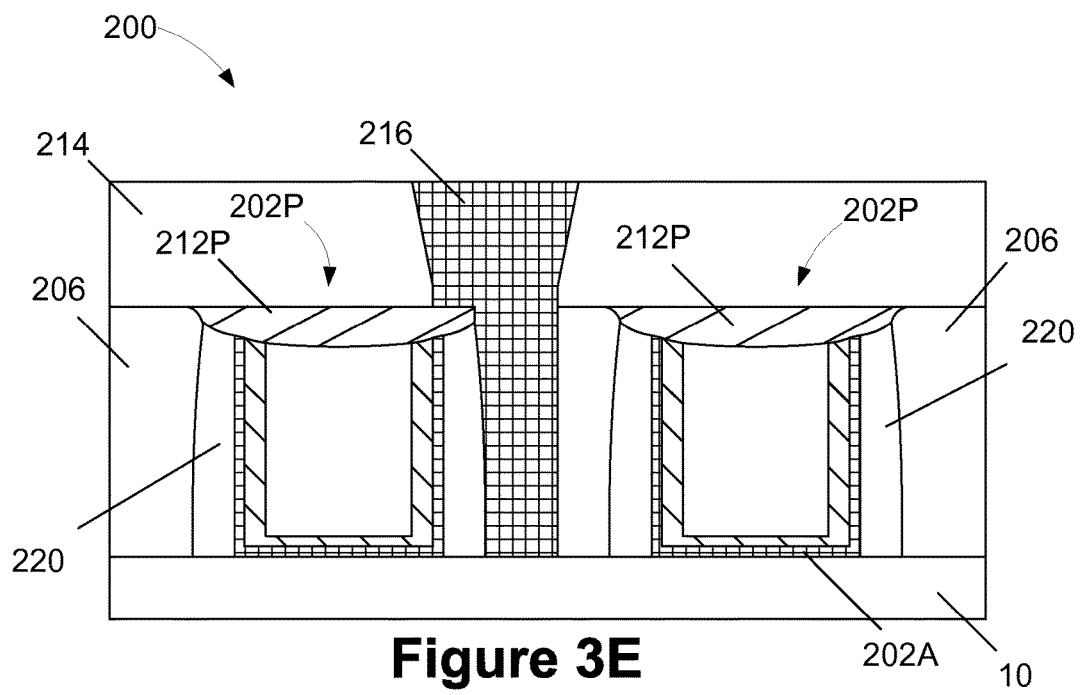

Then, as shown in FIG. 3C, the gate cap layer 212 (described above) is formed above the device 200 such that it over-fills the recesses 210. Next, as shown in FIG. 3D, another CMP process is performed to remove excess portions of the gate cap layer 212 positioned outside of the recesses 210. The process results in the definition of the previously described protective gate cap layers 212P positioned above each of the polished replacement gate structures 202P. As can be seen in FIG. 3D, the gate cap layer 212P and the sidewall spacers 220 encapsulate or protect the polished replacement gate structure 202P. FIG. 3E depicts the device 200 after several process operations have been performed to form the conductive contact 216 in the layers of insulating material 214, 206, as described above. In FIG. 3E, the conductive contact 216 is depicted as being slightly misaligned in that part of the conductive contact 216 is formed above the sidewall spacer 220 and a portion of the polished replacement gate structure 202P. However, the gate cap layer 212P protects the underlying polished replacement gate structure 202P from damage associated with the processes used to form the openings in the layers of insulating material 214, 206.

The particular embodiments disclosed above are illustrative only, as the invention may be modified and practiced in different but equivalent manners apparent to those skilled in the art having the benefit of the teachings herein. For example, the method steps set forth above may be performed in a different order. Furthermore, no limitations are intended by the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a replacement gate structure in a gate opening defined by sidewall spacers positioned in a layer of insulating material;
    performing a common etching process on at least said sidewall spacers and said layer of insulating material, wherein after completing said common etching process, an etched upper surface of said sidewall spacers is recessed relative to an etched upper surface of said layer of insulating material and an upper surface of said replacement gate structure extends above said etched upper surface of said layer of insulating material;
    after performing said common etching process, performing a first chemical mechanical polishing process to remove at least portions of said replacement gate structure that extend above said etched upper surface of said layer of insulating material and thereby define a polished replacement gate structure having a polished upper surface; and
    after performing said first chemical mechanical polishing process, forming a gate cap layer above said polished upper surface of said polished replacement gate structure.

2. The method of claim 1, wherein forming said gate cap layer comprises:
    forming a layer of gate cap material above said polished upper surface of said polished replacement gate structure; and
    performing a second chemical mechanical polishing process on said layer of gate cap material so as to define a substantially planar polished upper surface of said gate cap layer.

3. The method of claim 1, wherein said sidewall spacers are comprised of silicon nitride and said layer of insulating material is comprised of silicon dioxide.

4. The method of claim 3, wherein said common etching process is performed using a $C_xH_yF_z$ based etch chemistry.

5. The method of claim 4, wherein said common etching process is adjusted to provide etch selectivity between silicon nitride and silicon dioxide.

6. The method of claim 1, wherein said replacement gate structure is exposed to said common etching process.

7. The method of claim 1, wherein forming said replacement gate structure comprises performing a third chemical mechanical polishing process so that said upper surface of said replacement gate structure is substantially co-planar with an upper surface of said layer of insulating material, and wherein said common etching process is performed after said third chemical mechanical polishing process.

8. The method of claim 1, wherein said replacement gate structure comprises a first metal layer and a second metal layer positioned on said first metal layer, and wherein after performing said first chemical mechanical polishing process, a portion of a polished upper surface of said second metal layer is recessed below a portion of a polished upper surface of said first metal layer.

9. The method of claim 1, wherein performing said first chemical mechanical polishing process on said replacement gate structure further comprises performing said first chemical mechanical polishing process on said sidewall spacers, wherein after performing said first chemical mechanical polishing process, a portion of said polished upper surface of said replacement gate structure is recessed below a portion of a polished upper surface of said sidewall spacers, and wherein forming said gate cap layer comprises forming said gate cap layer on and in direct contact with said polished upper surface of said replacement gate structure and on and in direct contact with said polished upper surface of said sidewall spacers.

10. A method, comprising:
forming a replacement gate structure in a gate opening defined by sidewall spacers positioned in a layer of insulating material;
performing a common etching process on at least said sidewall spacers and said layer of insulating material, wherein after completing said common etching process, an etched upper surface of said sidewall spacers is recessed relative to an etched upper surface of said layer of insulating material and an upper surface of said replacement gate structure extends above said etched upper surface of said layer of insulating material;
after performing said common etching process, performing a first chemical mechanical polishing process to remove at least portions of said replacement gate structure that extend above said etched upper surface of said layer of insulating material and thereby define a polished replacement gate structure having a dished upper surface, said polished dished upper surface of said polished replacement gate structure defining a recess having a depth; and
after performing said first chemical mechanical polishing process, forming a gate cap layer above said polished dished upper surface of said polished replacement gate structure, said gate cap layer having a bottom surface that corresponds to said polished dished upper surface of said polished replacement gate structure.

11. The method of claim 10, wherein said replacement gate structure comprises a first metal layer and a second metal layer positioned on said first metal layer, and wherein after performing said first chemical mechanical polishing process, a portion of a polished upper surface of said second metal layer is recessed below a portion of a polished upper surface of said first metal layer.

12. The method of claim 10, wherein said replacement gate structure comprises a high-k gate insulation layer, a first metal layer positioned on said high-k gate insulation layer, and a second metal layer positioned on said first metal layer, and wherein after performing said first chemical mechanical polishing process, a portion of a polished upper surface of said second metal layer is recessed below a portion of a polished upper surface of said first metal layer and said portion of said polished upper surface of said first metal layer is recessed below a portion of a polished upper surface of said high-k gate insulation layer.

13. The method of claim 10, wherein performing said first chemical mechanical polishing process on said replacement gate structure further comprises performing said first chemical mechanical polishing process on said sidewall spacers, wherein after performing said first chemical mechanical polishing process, a portion of said polished upper surface of said replacement gate structure is recessed below a portion of a polished upper surface of said sidewall spacers, and wherein forming said gate cap layer comprises forming said gate cap layer on and in direct contact with said polished upper surface of said replacement gate structure and on and in direct contact with said polished upper surface of said sidewall spacers.

* * * * *